(12) United States Patent
Lin et al.

(10) Patent No.: US 11,635,832 B2
(45) Date of Patent: Apr. 25, 2023

(54) METHOD OF DRIVING TOUCH PANEL AND TOUCH WITH DISPLAY DRIVER SYSTEM USING THE SAME

(71) Applicant: NOVATEK Microelectronics Corp., Hsin-Chu (TW)

(72) Inventors: Yi-Ying Lin, Hualien County (TW); Chih-Chang Lai, Taichung (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 362 days.

(21) Appl. No.: 15/826,701

(22) Filed: Nov. 30, 2017

(65) Prior Publication Data

US 2018/0239488 A1 Aug. 23, 2018

Related U.S. Application Data

(60) Provisional application No. 62/460,718, filed on Feb. 17, 2017, provisional application No. 62/488,863, filed on Apr. 24, 2017.

(51) Int. Cl.
*G06F 3/041* (2006.01)
*G09G 3/3225* (2016.01)
(Continued)

(52) U.S. Cl.
CPC .......... *G06F 3/0412* (2013.01); *G06F 3/0443* (2019.05); *G06F 3/04166* (2019.05);
(Continued)

(58) Field of Classification Search
CPC ...... G06F 3/0416; G06F 3/0412; G06F 3/042; G06F 3/044; G09G 3/3225; G09G 3/3233;
(Continued)

(56) References Cited

U.S. PATENT DOCUMENTS 9,183,778 B2 * 11/2015 Lee .................. G09G 3/003
9,530,354 B2 * 12/2016 Tan .................. G06F 3/042
(Continued)

FOREIGN PATENT DOCUMENTS

CN 103208255 A 7/2013
CN 103383837 A 11/2013
(Continued)

OTHER PUBLICATIONS

"Advanced Food Non-thermal Processing Technology", Chen et al., p. 242, China Light Industry Press, Beijing, Aug. 2010.

*Primary Examiner* — Fred Tzeng
(74) *Attorney, Agent, or Firm* — Winston Hsu (57) ABSTRACT

The disclosure provides a method of driving a touch panel. The touch panel includes a plurality of touch sensing electrodes and a plurality of display pixels. Each of the plurality of display pixels includes a light emission element and a driving transistor. Each of the touch sensing electrodes is coupled to the light emission element of at least one of the plurality of display pixels. The method includes transmitting a first driving signal to at least one of the touch sensing electrodes served as an electrode of the corresponding light emission element during a touch sensing period, wherein the touch sensing electrode is coupled to a first power receiving terminal of the corresponding display pixel; and transmitting a first power supply voltage to the first power receiving terminal during a display period.

26 Claims, 10 Drawing Sheets (51) Int. Cl.
  *G06F 3/044* (2006.01)
  *H01L 27/32* (2006.01)
(52) U.S. Cl.
  CPC ... *G09G 3/3225* (2013.01); *G09G 2310/0267* (2013.01); *G09G 2310/0289* (2013.01); *G09G 2310/08* (2013.01); *G09G 2354/00* (2013.01); *H01L 27/323* (2013.01)
(58) Field of Classification Search
  CPC .... G09G 3/3266; G09G 3/2003; G09G 3/003; H01L 27/323; H01L 51/5296
  USPC ......................................................... 345/174
  See application file for complete search history.

(56) References Cited

U.S. PATENT DOCUMENTS

| | | | | |
|---|---|---|---|---|
| 9,934,711 | B2* | 4/2018 | Yeo | G06F 1/1601 |
| 10,152,916 | B2* | 12/2018 | Wang | G09G 3/2003 |
| 10,613,690 | B2 | 4/2020 | Takahashi | |
| 10,627,966 | B2 | 4/2020 | Na | |
| 2007/0242004 | A1* | 10/2007 | Oooka | G09G 3/3225 |
| | | | | 345/76 |
| 2010/0013824 | A1* | 1/2010 | Kim | G09G 3/3266 |
| | | | | 345/214 |
| 2011/0043487 | A1 | 2/2011 | Huang | |
| 2014/0022583 | A1 | 1/2014 | Ikeura | |
| 2014/0077180 | A1* | 3/2014 | Moon | H01L 51/5296 |
| | | | | 257/40 |
| 2014/0198067 | A1* | 7/2014 | Jeon | G06F 3/0416 |
| | | | | 345/173 |
| 2014/0225838 | A1 | 8/2014 | Gupta | |
| 2015/0301674 | A1 | 10/2015 | Tan | |
| 2016/0041676 | A1* | 2/2016 | Tan | G06F 3/0416 |
| | | | | 345/173 |
| 2016/0351631 | A1 | 12/2016 | Lee | |
| 2016/0379560 | A1* | 12/2016 | Cho | G09G 3/3233 |
| | | | | 345/76 |
| 2017/0316740 | A1* | 11/2017 | Yang | G06F 3/0412 |
| 2017/0337884 | A1 | 11/2017 | Kurokawa | |
| 2018/0143729 | A1 | 5/2018 | Lee | |

FOREIGN PATENT DOCUMENTS

| | | |
|---|---|---|
| CN | 103777798 A | 5/2014 |
| CN | 104036698 A | 9/2014 |
| CN | 104750339 A | 7/2015 |
| CN | 104898888 A | 9/2015 |

* cited by examiner

FIG. 13

METHOD OF DRIVING TOUCH PANEL AND TOUCH WITH DISPLAY DRIVER SYSTEM USING THE SAME

CROSS REFERENCE TO RELATED APPLICATIONS

This application claims the benefit of U.S. Provisional Application No. 62/460,718, filed on Feb. 17, 2017, and U.S. Provisional Application No. 62/488,863, filed on Apr. 24, 2017, the contents of which are incorporated herein by reference.

BACKGROUND OF THE INVENTION

1. Field of the Invention

The present invention relates to a touch driving and sensing method and a related touch with display driver system, and more particularly, to a self-capacitance touch driving and sensing method applied in an in-cell touch panel of a touch with display driver system.

2. Description of the Prior Art

An organic light-emitting diode (OLED) is a light-emitting diode (LED) in which the emissive electroluminescent layer is a film of organic compound, where the organic compound can emit light in response to an electric current. OLEDs are widely used in displays of electronic devices such as television screens, computer monitors, and portable systems such as mobile phones, handheld game consoles and personal digital assistants (PDAs). An active matrix OLED (AMOLED), which is driven by a thin-film transistor (TFT) and contains a storage capacitor that maintains the pixel states to enable large size and large resolution displays, becomes the mainstream of the OLED displays.

Modern electronic products are equipped with touch sensing functions on their display panel such as an OLED panel, to realize a touch panel. The touch panel requires touch sensing electrodes for touch sensing operations, allowing a user to perform various functions by touching the panel using a finger or other objects. Thus, how to integrate the touch sensing electrodes with the display panel and how to perform touch sensing operations on a touch panel have become important issues to be dealt with in the industry.

SUMMARY OF THE INVENTION

It is therefore an objective of the disclosure to provide a method of driving a touch panel and a related touch with display driver system, where the touch with display driver system may apply in-cell technology with a self-capacitance touch sensing method. The in-cell technology allows the touch with display driver system to have a lower cost and complexity. The self-capacitance touch sensing has higher signal strength and thus achieves higher reliability.

An embodiment of the present invention discloses a method of driving a touch panel. The touch panel comprises a plurality of touch sensing electrodes and a plurality of display pixels. Each of the plurality of display pixels comprises a light emission element and a driving transistor. Each of the touch sensing electrodes is coupled to the light emission element of at least one of the plurality of display pixels. The method comprises transmitting a first driving signal to at least one of the touch sensing electrodes served as an electrode of the corresponding light emission element during a touch sensing period, wherein the touch sensing electrode is coupled to a first power receiving terminal of the corresponding display pixel; and transmitting a first power supply voltage to the first power receiving terminal during a display period.

An embodiment of the present invention further discloses a touch with display driver system, which comprises a touch panel and a controller. The touch panel comprises a plurality of display pixels and a touch sensing electrode layer. Each of the plurality of display pixels comprises a light emission element and a driving transistor. The touch sensing electrode layer comprises a plurality of touch sensing electrodes, each of which coupled to the light emission element of at least one of the plurality of display pixels. The controller, coupled to the touch sensing electrode layer and a first power receiving terminal of the plurality of display pixels, is configured for transmitting a first driving signal to at least one of the touch sensing electrodes served as an electrode of the corresponding light emission element during a touch sensing period, wherein the touch sensing electrode is coupled to the first power receiving terminal of the corresponding display pixel.

These and other objectives of the present invention will no doubt become obvious to those of ordinary skill in the art after reading the following detailed description of the preferred embodiment that is illustrated in the various figures and drawings.

DETAILED DESCRIPTION

Figure 1A:
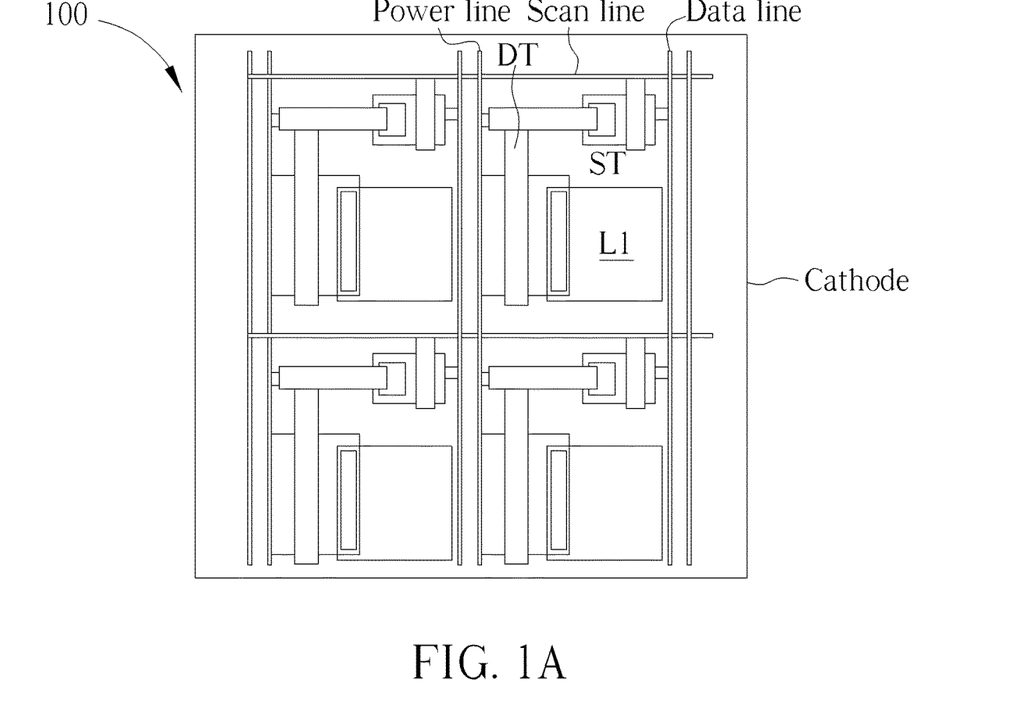
FIGS. 1A and 1B are schematic diagrams of a layout structure of an OLED panel.
Figure 1B:
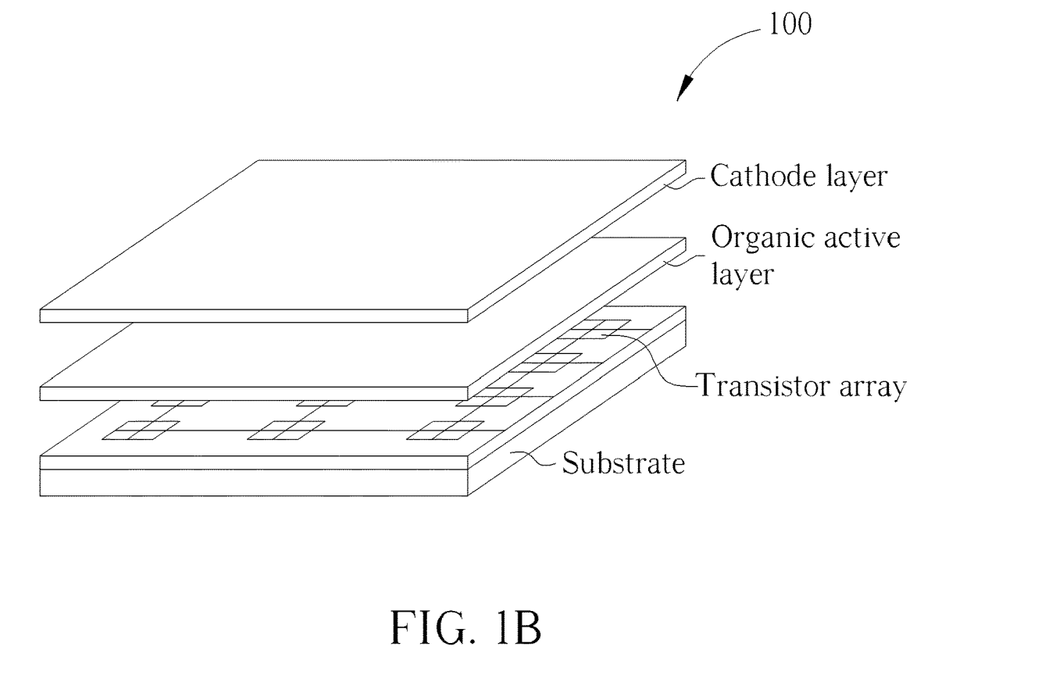

Please refer to FIGS. 1A and 1B, which are schematic diagrams of a layout structure of an organic light emitting diode (OLED) panel 100. FIG. 1A illustrates the top view of the OLED panel 100, which includes a plurality of display pixels. There are 4 pixels illustrated in FIG. 1A, but those skilled in the art should know that there may be much more display pixels in the OLED panel 100. For example, if an OLED panel supports the resolution 1024×768, there should be at least 1024×768 display pixels or 1024×768×3 subpixels included in the OLED panel. In the OLED panel 100, each display pixel includes an OLED L1, a switch transistor ST and a driving transistor DT, as a basic 2T1C structure of the active-matrix OLED (AMOLED) panel. The transistors in the display pixels may be thin-film transistors (TFTs) implemented with a TFT process. The OLED panel 100 further includes a plurality of power lines, data lines and scan lines for controlling operations of the OLED panel 100.

FIG. 1B illustrates a simplified structure of the OLED panel 100 from the side view. The OLED panel 100 includes a cathode layer, organic active layers, a transistor array and a substrate. The transistor array, which is disposed on the substrate, includes the switch transistors and driving transistors in the display pixels as shown in FIG. 1A. The organic active layers include light emitting materials such as the OLEDs. The cathode layer refers to the layer where the cathode electrode of the OLEDs is disposed. The OLEDs also have an anode electrode, which is omitted in FIG. 1B.

The present invention provides an OLED panel with touch sensing functions. The touch panel has an in-cell structure. In order to save costs, the touch sensing functions are preferably embedded in the OLED panel without adding additional layers and/or devices; hence, the touch sensing operations are realized in currently available layers of a general OLED panel. In an embodiment, the touch driving signals may be transmitted to the cathode electrode of the OLEDs. Further, the driving lines for transmitting the touch driving signals may be disposed in metal layers where the power lines and data lines are disposed, and no additional metal layer is required.

Figure 2:
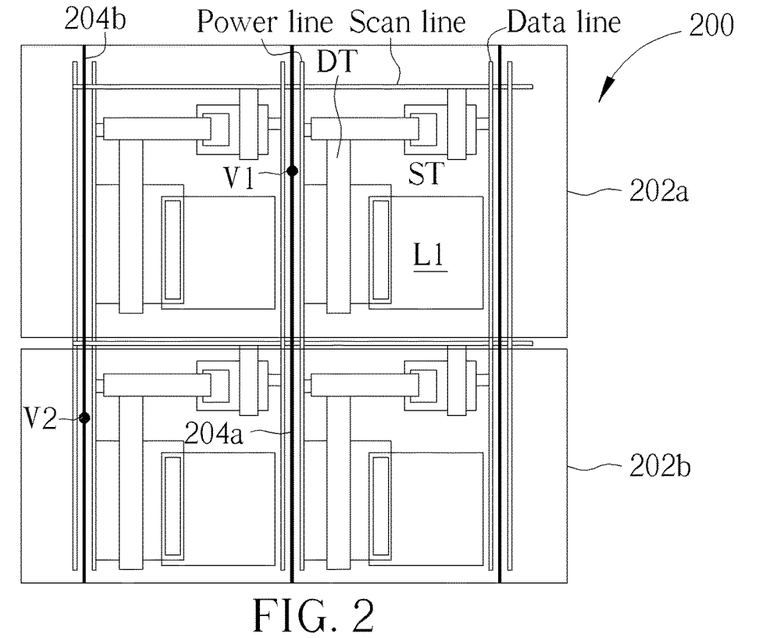
FIG. 2 is a schematic diagram of an OLED panel according to an embodiment of the present invention.

Please refer to FIG. 2, which is a schematic diagram of an OLED panel 200 according to an embodiment of the present invention. The OLED panel 200 has a 2T1C structure similar to the OLED panel 100; hence, the elements and signals having similar functions are denoted by the same symbols. The difference between the OLED panels 100 and 200 is that, in the OLED panel 200, the cathode layer is segmented into several parts; hence, the touch driving and sensing operations may be implemented on the cathode layer, and each part of the cathode layer operates as a touch sensing electrode to receive a touch driving signal. As shown in FIG. 2, the cathode layer includes at least two segmentations, i.e., touch sensing electrodes 202a and 202b.

The touch driving signals are transmitted to the touch sensing electrodes 202a and 202b via driving lines 204a and 204b, respectively. The touch sensing signals corresponding to the touch driving signals may also be transmitted via the same driving lines 204a and 204b, to realize a self-capacitance touch sensing operation. As mentioned above, the driving lines 204a and 204b may be disposed in a currently available metal layer without additional circuit costs. Preferably, each of the driving lines 204a and 204b for transmitting the driving and sensing signals is disposed between a power line and its adjacent data line in the same metal layer, as shown in FIG. 2. The disposition prevents the display efficiency of the OLED panel from being reduced since the driving lines 204a and 204b do not block the light emission paths of the OLEDs in the display pixels, even when top emission display is applied. The driving lines 204a and 204b are connected to the touch sensing electrodes 202a and 202b through vias V1 and V2, respectively.

Please note that the deployment of the driving lines 204a and 204b is one of various embodiments of the present invention. In another embodiment, the driving lines for transmitting the touch driving and sensing signals may be implemented in other manner. For example, there may be two or more driving lines disposed between a power line and its adjacent data line. The allocation of the driving lines may be determined according to the segmentation and deployment of the touch sensing electrodes in the touch panel. In another embodiment, the driving lines for transmitting the touch driving and sensing signals may be disposed in another metal layer.

Figure 3:
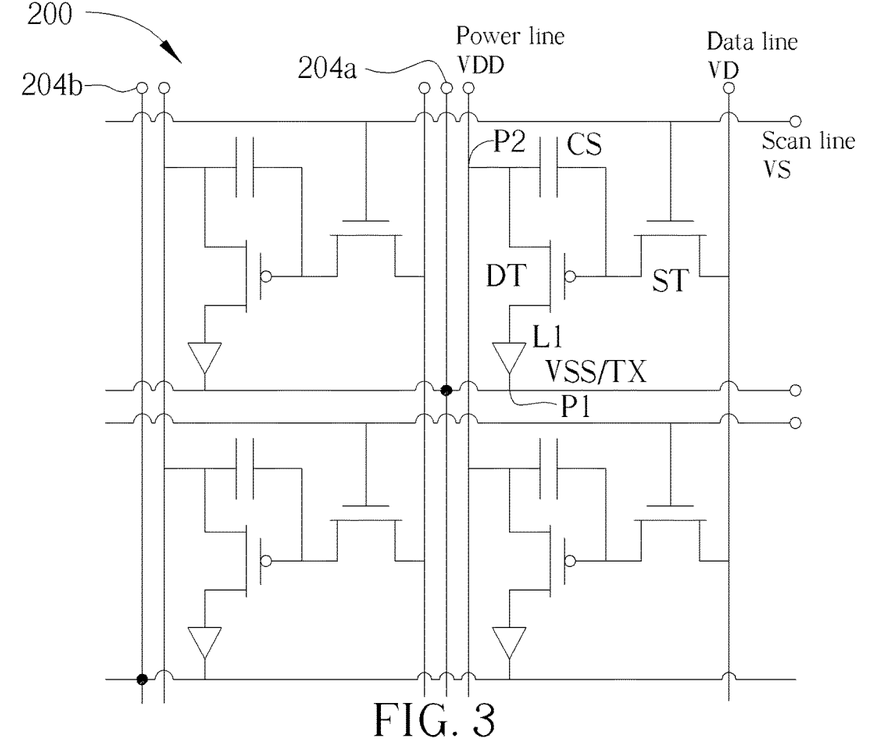
FIG. 3 illustrates a circuit structure corresponding to the layout structure of the OLED panel shown in FIG. 2.

FIG. 3 illustrates a circuit structure corresponding to the layout structure of the OLED panel 200 shown in FIG. 2, and the switch transistor ST, the driving transistor DT and the OLED L1 are illustrated in each display pixel. Each display pixel further includes a capacitor CS. The switch transistor ST, controlled by a scan signal VS, forwards display data VD to the gate terminal of the driving transistor DT when turned on. The capacitor CS maintains the voltage difference between the gate terminal and source terminal of the driving transistor DT. The OLED L1 is coupled between the drain terminal of the driving transistor DT and a power receiving terminal P1. More specifically, the anode electrode of the OLED L1 is coupled to the drain terminal of the driving transistor DT, and the cathode electrode of the OLED L1 is coupled to the power receiving terminal P1. The cathode electrode of the OLED L1, which acts as a touch sensing electrode in the cathode layer, receives a power supply voltage VSS or a touch driving signal TX from a controller via the driving line 204a or 204b. The driving transistor DT is coupled between the OLED L1 and another power receiving terminal P2, for receiving a power supply voltage VDD and controlling the OLED L1 to emit light. In this embodiment, the driving transistor DT is a P-type metal oxide semiconductor (PMOS) transistor. When a current flowing through the drain terminal of the driving transistor DT to the OLED L1 and the OLED L1 is forward biased, the OLED L1 is able to emit light. As mentioned above, the switch transistor ST and the driving transistor DT may be TFT transistors implemented with a TFT process, but are not limited herein.

Figure 4:
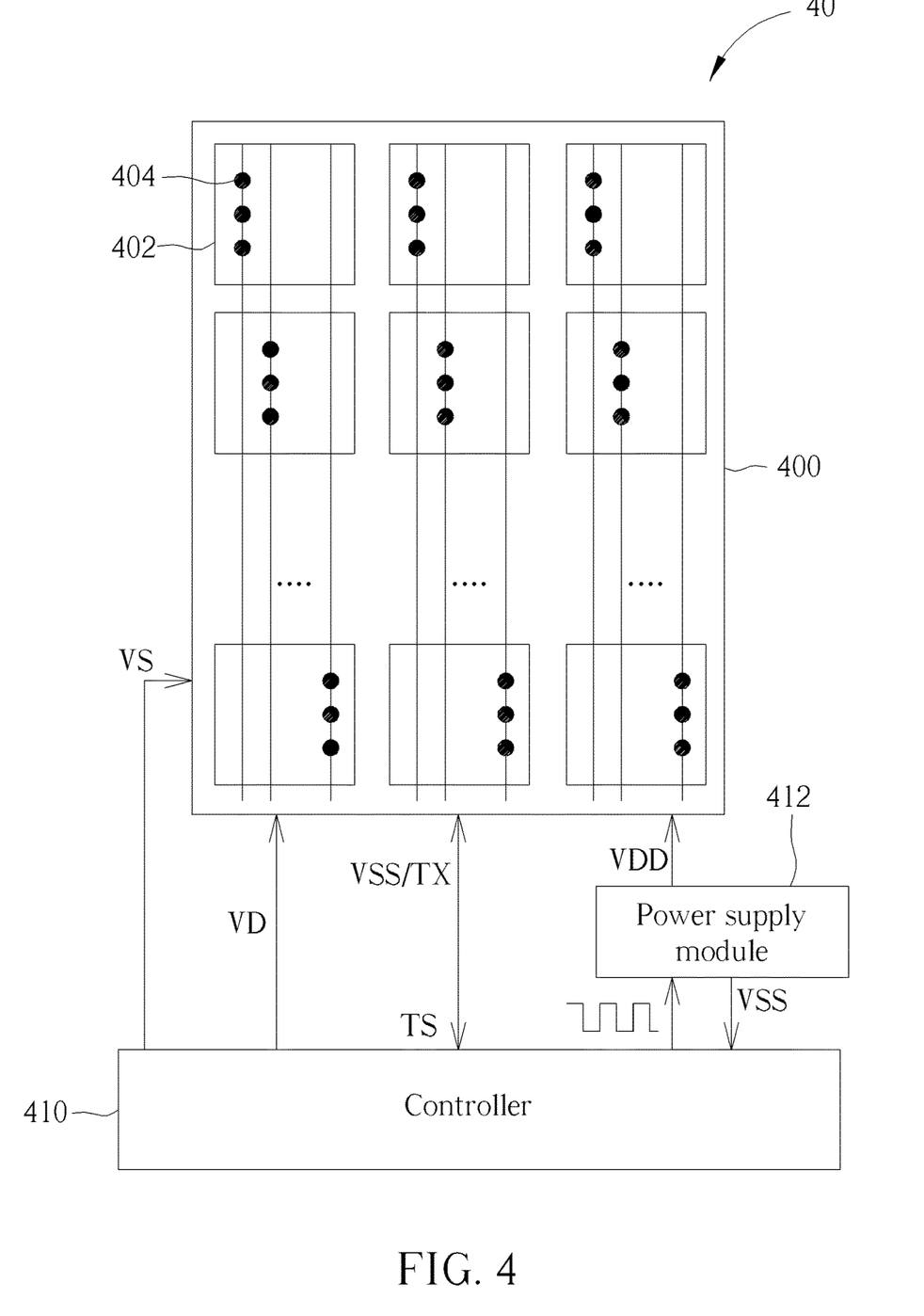
FIG. 4 is a schematic diagram of a touch with display driver system according to an embodiment of the present invention.

Please refer to FIG. 4, which is a schematic diagram of a touch with display driver system 40 according to an embodiment of the present invention. As shown in FIG. 4, the touch with display driver system 40 includes a touch panel 400, a controller 410 and a power supply module 412. The touch panel 400 is a display panel with touch sensing function, and the touch panel 400 may be an OLED panel such as the OLED panel 200 shown in FIG. 2, but is not limited thereto. The touch panel 400 includes a plurality of display pixels, and includes a touch sensing electrode layer having a plurality of touch sensing electrodes 402 arranged in an array. Each of the display pixels includes a light emission element such as an OLED. Each of the touch sensing electrodes 402 is coupled to the light emission element of at least one of the display pixels. As shown in FIG. 4, the touch sensing electrode layer includes several touch sensing electrodes 402, and each touch sensing electrode 402 may overlap several display pixels (not illustrated). A touch sensing electrode may be coupled to the light emission element in its overlapping display pixels. The touch driving signals are transmitted to the touch sensing electrodes 402 through vias 404. The deployments and connections of the display pixels and the touch sensing electrodes 402 may be determined according to the numbers of display pixels and the touch sensing electrodes 402 in the touch panel 400. For example, if the touch panel 400 includes 1000×500 display pixels and 50 touch sensing electrodes arranged in a 10×5 array, the light emission elements in every 100×100 display pixels are coupled to one touch sensing electrode.

The controller 410 is coupled to each of the touch sensing electrodes 402 and also coupled to the display pixels in the touch panel 400. Please refer to FIG. 4 together with FIG. 3. The touch panel 400 is supposed to be the OLED panel 200. The controller 410 is coupled to the touch sensing electrodes 202a and 202b and the power receiving terminal P1 of the corresponding display pixels. During a touch sensing period, the controller 410 transmits a touch driving signal TX to the touch sensing electrode 202a (i.e., the cathode electrode of the OLED L1) via the driving line 204a. In this embodiment, the touch sensing operation is a self-capacitance touch sensing operation, and the controller 410 correspondingly receives a touch sensing signal TS from the touch sensing electrode 202a. In such a situation, the cathode electrode of the OLED L1 acts as a touch sensing electrode for receiving the touch driving signal TX. During a display period, the controller 410 transmits a power supply voltage VSS to the power receiving terminal P1, which is also coupled to the cathode electrode of the OLED L1. In such a situation, the cathode electrode of the OLED L1 acts as a power receiving terminal for receiving the power supply voltage VSS. The power supply voltage VSS may be supplied from the power supply module 412 and forwarded to the touch panel 400 by the controller 410.

The controller 410 may also include a source driver and a gate driver, respectively configured for outputting the display data VD and the scan signal VS to the touch panel 400. Detailed implementations of outputting the display data VD and the scan signal VS are well known by those skilled in the art, and are omitted herein. The power supply module 412 supplies a power supply voltage VDD for the touch panel 400 and also supplies power for the controller 410.

Figure 5:
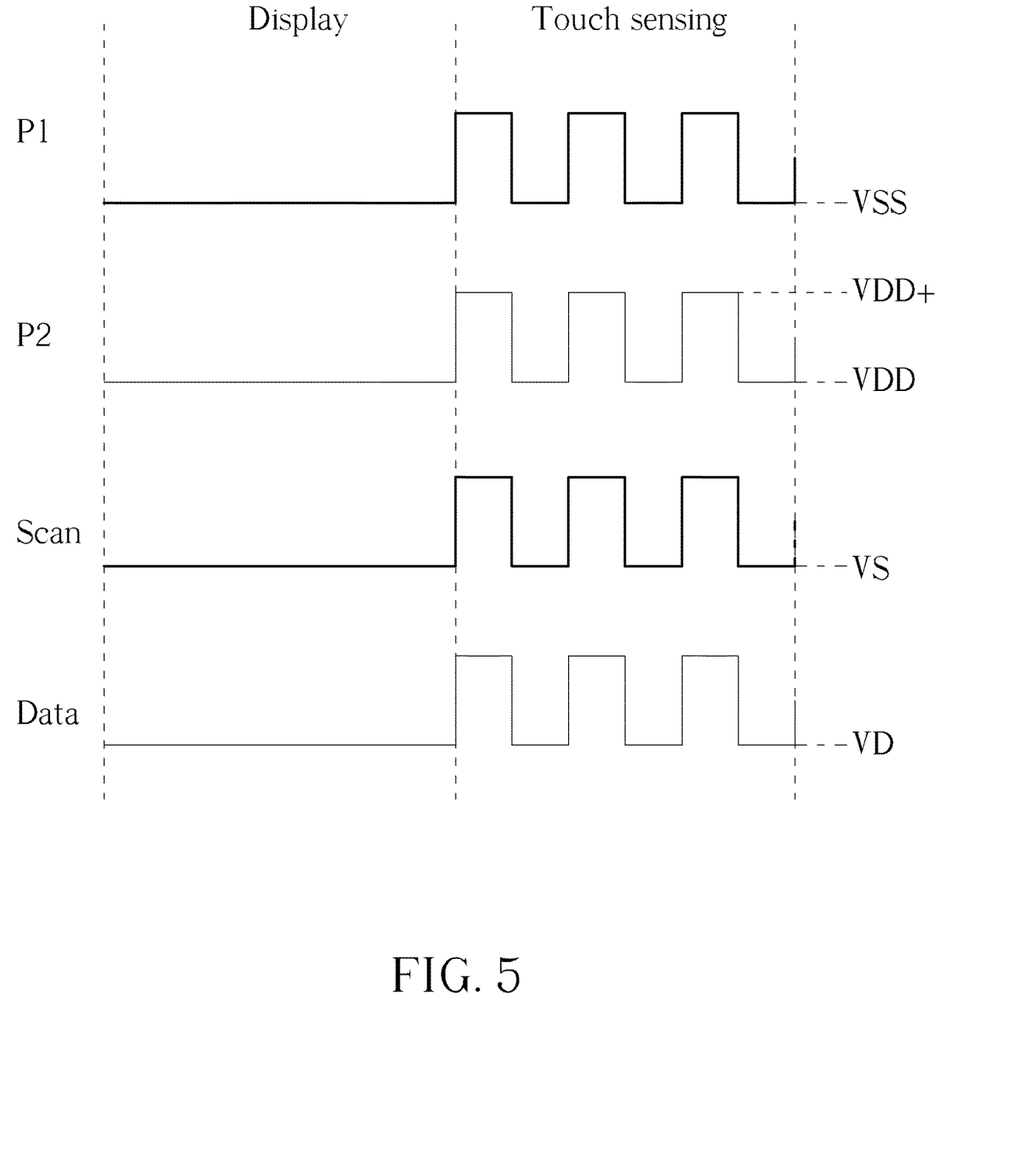
FIG. 5 is a waveform diagram of signals in the OLED panel shown in FIG. 3.

Please refer to FIG. 5, which is a waveform diagram of signals in the OLED panel 200 shown in FIG. 3. During the display period, the driving line 204a forwards the power supply voltage VSS to the power receiving terminal P1 and the cathode electrode of the OLED L1, and the power line forwards the power supply voltage VDD to the power receiving terminal P2 and the source terminal of the driving transistor DT. The power supply voltage VDD is higher than the power supply voltage VSS, so that the OLED L1 is forward biased and is able to emit light for image display. The switch transistor ST is turned on by the scan signal VS and the display data VD is written into the gate voltage of the driving transistor DT through the switch transistor ST. The drain current Id of the driving transistor DT follows the following formula:

$$Id = (k/2) \times (Vgs - Vth)^2;$$

where k refers to the conduction parameter of the driving transistor DT, Vgs is the gate-to-source voltage of the driving transistor DT, and Vth is the threshold voltage of the driving transistor DT. The drain current Id, which flows through the OLED L1, may control the OLED L1 to emit light. The voltage difference across the OLED L1 may determine the brightness of the OLED L1. During the display period, the signals or voltages VDD, VSS, VS and VD may be outputted as a constant voltage within a display cycle of a pixel, as shown in FIG. 5.

During the touch sensing period, the switch transistor ST is turned off. The controller starts to transmit a touch driving signal to the touch sensing electrode. In other words, the cathode electrode of the OLED L1 receiving the power supply voltage VSS during the display period starts to receive the touch driving signal. Note that the OLED L1 may still emit light during the touch sensing period. In such a situation, the OLED panel 200 may still display an image, as in the display period. However, the touch driving signal may influence the image displayed by the OLED panel 200. For example, if a touch driving signal is transmitted to the cathode electrode of an OLED which is emitting light, the voltage difference across the OLED may vary and the image displayed by the panel may flicker due to the touch driving signal.

In order to prevent the image displayed by the OLED panel 200 from being influenced by the touch driving signal, the display pixels are required to generate a constant brightness in the touch sensing period as the brightness generated in the display period. Therefore, when the touch driving signal is transmitted during the touch sensing period, the driving transistor DT and the OLED L1 in the display pixels keep turned on, and another driving signal is transmitted to the power receiving terminal P2 via the power line, such as the rectangular wave signal shown in FIG. 5. To achieve this, the touch driving signal transmitted to the power receiving terminal P1 can be varied together with the driving signal transmitted to the power receiving terminal P2. Preferably but not limitedly, the touch driving signal transmitted to the power receiving terminal P1 and the driving signal transmitted to the power receiving terminal P2 have the same amplitude, frequency and phase. In such a situation, the voltage difference across the OLED L1 may be constant, so that the brightness of the OLED L1 may also be constant. The turned-off switch transistor ST and the coupling of the capacitor CS allow the gate-to-source voltage Vgs of the driving transistor DT to be constant and thus maintain the balance of the driving transistor DT, so that the driving transistor DT may not influence the brightness of the OLED L1. Note that the rectangular wave signal is one of various implementations of touch driving signals, and those skilled in the art should know that the touch driving signals may be implemented with other type of signal such as a sinusoidal wave signal. In addition, the frequency and number of the touch driving signals in each touch sensing operation may be controlled arbitrarily, and this should not be a limitation of the present invention.

Therefore, the OLED L1 may still emit light with a constant brightness during the touch sensing period. As a result, the touch sensing operation may not reduce the light emitting time of the OLED L1, so that the entire brightness of the OLED panel may not be reduced due to the touch sensing operation.

As mentioned above, the power supply module 412 supplies the power supply voltage VDD for the touch panel 400, as shown in FIG. 4. During the touch sensing period, the rectangular wave driving signal transmitted to the touch panel 400 may be switched between two voltage levels. For example, as shown in FIG. 5, the driving signal is switched between the power supply voltage VDD and a higher power supply voltage VDD+.

Figure 6:
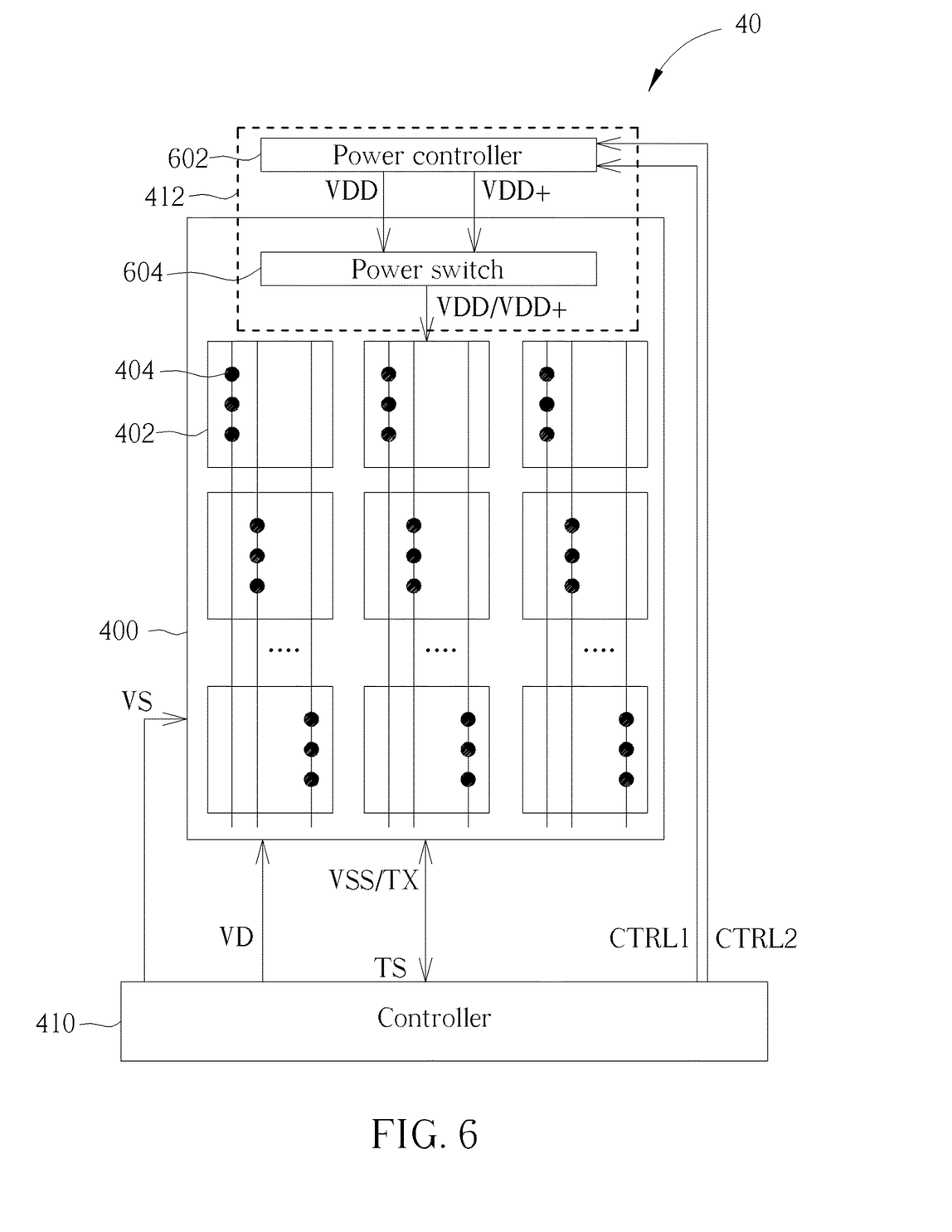
FIG. 6 illustrates the touch with display driver system with an exemplary implementation of the power supply module.

FIG. 6 illustrates the touch with display driver system 40 with an exemplary implementation of the power supply module 412. As shown in FIG. 6, the power supply module 412 includes a power controller 602 and a power switch 604. The power controller 602 may generate the power supply voltages VDD and VDD+ according to control of the controller 410, e.g., via control signals CTRL1 and CTRL2. The power switch 604, which is coupled to the power controller 602, may generate the driving signal by outputting the power supply voltages VDD and VDD+ alternately. The driving signal is transmitted to the power receiving terminal P2 while the touch driving signal is transmitted to the power receiving terminal P1 during the touch sensing period. The power switch 604 may be implemented in the touch panel with the TFT process and include several transistors (i.e., TFTs) and/or a multiplexer. The power switch 604 may output the driving signal switched between the power supply voltages VDD and VDD+ during the touch sensing period, and output the power supply voltage VDD during the display period.

Figure 7:
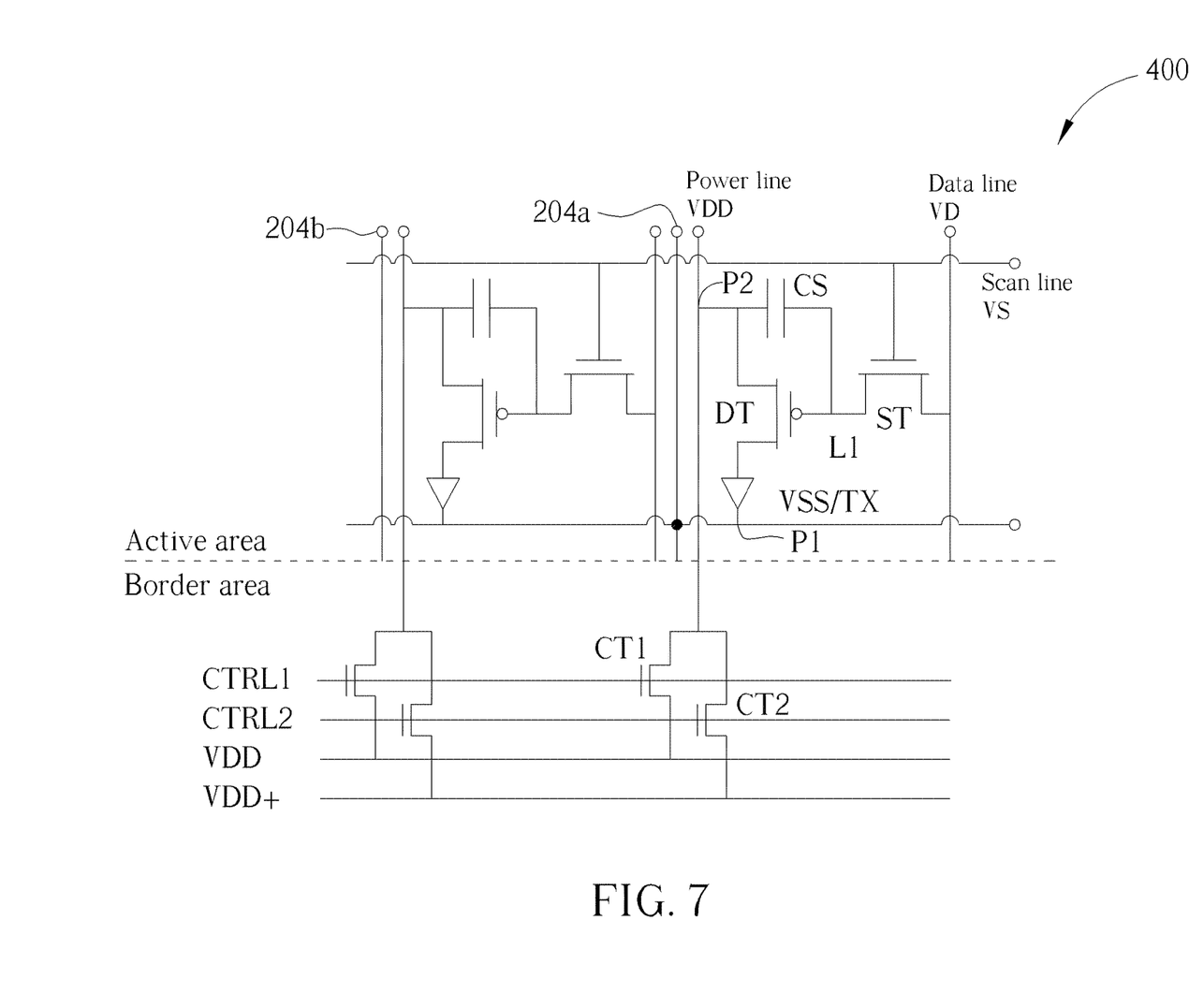
FIG. 7 illustrates the touch panel with an exemplary implementation of the power switch.

FIG. 7 illustrates the touch panel 400 (which is supposed to be the OLED panel 200 in this case) with an exemplary implementation of the power switch 604. As shown in FIG. 7, the power switch 604 includes control transistors CT1 and CT2 disposed in a border area of the touch panel 400, while the display pixels are disposed in an active area of the touch panel 400. Each power line is connected to a terminal of two control transistors CT1 and CT2, and another terminal of the control transistors CT1 and CT2 receives the power supply voltages VDD and VDD+, respectively. The control transistors CT1 and CT2 are controlled by the control signals CTRL1 and CTRL2, respectively. During the display period, the control signal CTRL1 turns on the control transistor CT1 and the control signal CTRL2 turns off the control transistor CT2; hence, the power supply voltage VDD is continuously transmitted to the power line and the power receiving terminal P2 of the display pixel. During the touch sensing period, the control transistors CT1 and CT2 are alternately turned on, and the power supply voltages VDD and VDD+ are alternately transmitted to the power line and the power receiving terminal P2 of the display pixel. The control signals CTRL1 and CTRL2 may control the frequency and phase of switching between the power supply voltages VDD and VDD+ to be synchronous to the touch driving signal transmitted to the power receiving terminal P1 or the cathode electrode of the OLED L1, in order to control the voltage difference across the OLED L1 to be constant.

Please note that there are significant capacitive loads on a touch panel since the power lines, data lines, scan lines, and driving lines on the touch panel are quite long and parasitic capacitors may be generated between any two of these lines. The capacitive loads may generate tremendous noise interference on the touch sensing signals and thus reduce the touch sensing performance. In order to reduce the influence of the capacitive loads, partial or all metal lines on the touch panel may be driven by an identical driving signal when the touch driving signal is transmitted to the driving lines; hence, the parasitic capacitors on the touch panel may not be charged or discharged since the voltage difference across any of the parasitic capacitors may not change. In such a situation, the effective capacitive loads may become zero when none of the parasitic capacitors is charged or discharged due to variations of the voltage difference.

Therefore, during the touch sensing period when the touch driving signal is transmitted to the touch sensing electrodes, an identical driving signal is transmitted to the data lines and scan lines of the touch panel. These driving signals substantially have the same amplitude, frequency and phase, as the rectangular wave signals shown in FIG. 5. Simultaneously, the power lines may also receive the identical driving signal to retain the brightness of the OLEDs. In such a situation, the parasitic capacitors between any two of these lines may not generate noise interference on the touch sensing signals since the voltage difference across any two lines may not change. It should be noted that if there are any other control lines on the touch panel, the control lines may also be driven by the identical driving signal to maintain the performance of the touch sensing operations in the touch with display driver system.

Please note that the present invention aims at providing a method of driving the touch panel and a related touch with display driver system. Those skilled in the art may make modifications and alternations accordingly. For example, the structure of the display pixels shown in FIG. 3 is one of various possible embodiments of the present invention. In another embodiment, a display pixel may include more than two transistors. For example, a display pixel having brightness compensation functions may include more TFTs for controlling the compensation operations. In the above embodiments, the driving transistor is a PMOS transistor; while in another embodiment, the driving transistor may be an N-type metal oxide semiconductor (NMOS) transistor. Note that the method of driving the touch panel described in the present disclosure is applicable to any touch panel having different display pixel structures.

Figure 8:
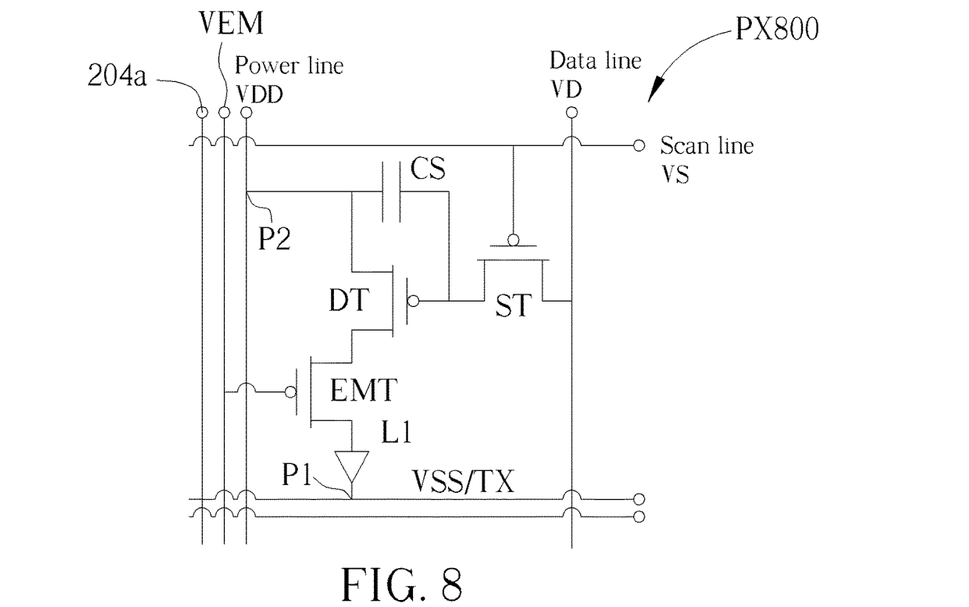
FIG. 8 is a schematic diagram of a display pixel of a touch panel according to an embodiment of the present invention.

Please refer to FIG. 8, which is a schematic diagram of a display pixel PX800 of a touch panel according to an embodiment of the present invention. The structure of the display pixel PX800 is similar to the structure of the display pixel in the touch panel 200; hence, the elements and signals having similar functions are denoted by the same symbols. The difference between the display pixel PX800 and the display pixel in the touch panel 200 is that, in addition to the driving transistor DT and the switch transistor ST, the display pixel PX800 further includes an emission control transistor EMT. The emission control transistor EMT is a PMOS transistor coupled between the driving transistor DT and the OLED L1. More specifically, the source terminal of the emission control transistor EMT is coupled to the drain terminal of the driving transistor DT, and the drain terminal of the emission control transistor EMT is coupled to the anode electrode of the OLED L1. The emission control transistor EMT, which is considered as a switch controlling the current flowing through the OLED L1, is controlled by an emission control signal VEM. In other words, the emission control signal VEM may turn the emission control transistor EMT on or off to allow the OLED L1 to emit light or not.

In an embodiment, the display operation may be interrupted while the touch driving signal is transmitted during the touch sensing period. The emission control transistor EMT is turned off to block the current (i.e., the drain current Id of the driving transistor DT) flowing to the OLED L1. At the same time, the cathode terminal of the OLED L1 receives a touch driving signal for touch sensing operation. The power receiving terminal P2 may not need to receive an identical driving signal to retain the brightness of the OLED L1. Alternatively, the power receiving terminal P2 may receive an identical driving signal from the controller via the power line, and the data line and the scan line may also be driven by the identical driving signal, to reduce the capacitive loads on the touch panel.

Figure 9:
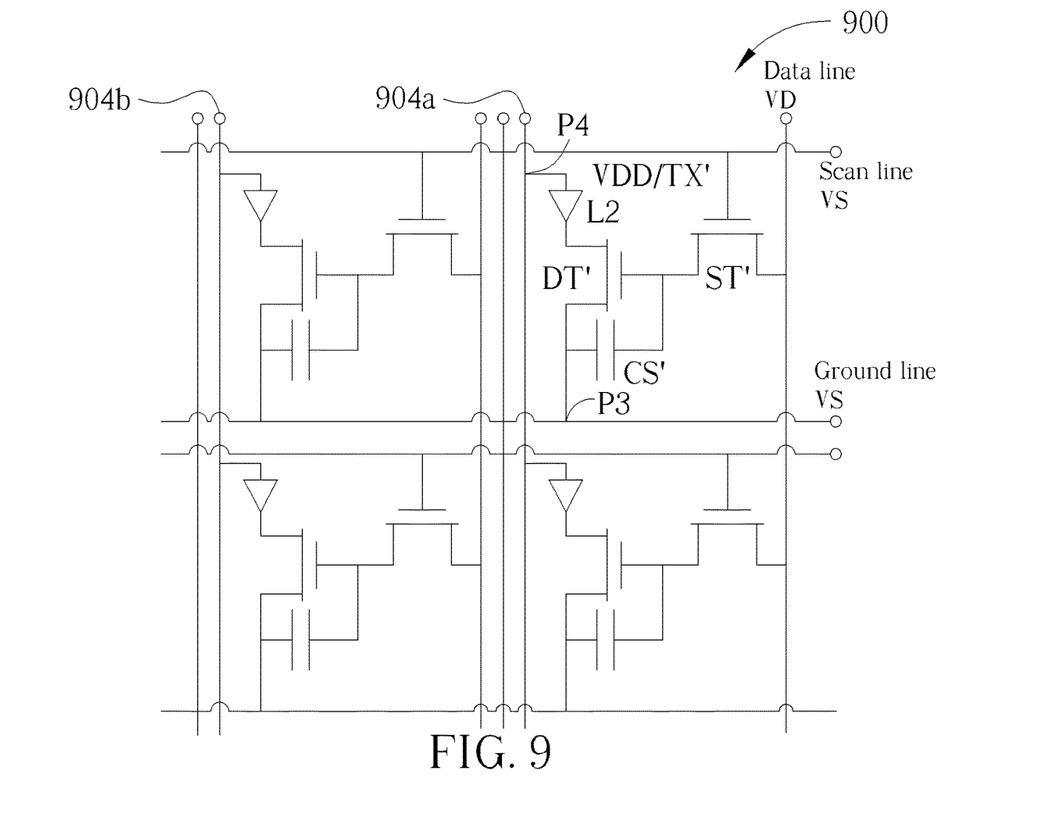
FIG. 9 is a schematic diagram of a circuit structure of an OLED panel according to an embodiment of the present invention.

Please refer to FIG. 9, which is a schematic diagram of a circuit structure of an OLED panel 900 according to an embodiment of the present invention. Each display pixel of the OLED panel 900 includes a switch transistor ST', a driving transistor DT', an OLED L2 and a capacitor CS'. The difference between the display pixel of the OLED panel 900 and the display pixel of the OLED panel 200 is that, the driving transistor DT' in the OLED panel 900 is an NMOS transistor while the driving transistor DT in the OLED panel 200 is a PMOS transistor. In the display pixel of the OLED panel 900, the OLED L2 is coupled between the drain terminal of the driving transistor DT' and a power receiving terminal P4. More specifically, the anode electrode of the OLED L2 is coupled to the power receiving terminal P4, and the cathode electrode of the OLED L2 is coupled to the drain terminal of the driving transistor DT'. The anode electrode of the OLED L2, which acts as a touch sensing electrode in an anode layer, receives a power supply voltage VDD or a touch driving signal TX' from a controller via driving line 904a or 904b. The driving transistor DT' is coupled between the OLED L2 and another power receiving terminal P3, for receiving a power supply voltage VSS and controlling the OLED L2 to emit light. The power supply voltage VSS may be transmitted via a ground line. When a current flowing from the OLED L2 to the drain terminal of the driving transistor DT' and the OLED L2 is forward biased, the OLED L2 is able to emit light. The operations of the data lines, the scan lines, the switch transistor ST' and the capacitor CS' are similar to those in the OLED panel 200, and will not be narrated herein.

During the display period, the driving line 904a forwards the power supply voltage VDD to the power receiving terminal P4 and the anode electrode of the OLED L2, and the ground line forwards the power supply voltage VSS to the power receiving terminal P3 and the source terminal of the driving transistor DT'. The power supply voltage VDD is higher than the power supply voltage VSS, so that the OLED L2 is forward biased and is able to emit light for image display. The drain current Id of the driving transistor DT', which flows through the OLED L2, may control the OLED L2 to emit light. The voltage difference across the OLED L2 may determine the brightness of the OLED L2.

During the touch sensing period, the switch transistor ST' is turned off. The controller starts to transmit a touch driving signal to the touch sensing electrode. In other words, the anode electrode of the OLED L2 receiving the power supply voltage VDD during the display period starts to receive the touch driving signal. Note that the OLED L2 may still emit light during the touch sensing period. In such a situation, the OLED panel 900 may still display an image, as in the display period. However, the touch driving signal may influence the image displayed by the OLED panel 900. For example, if a touch driving signal is transmitted to the anode electrode of an OLED which is emitting light, the voltage difference across the OLED may change and the image displayed by the panel may flicker due to the touch driving signal.

In order to prevent the image displayed by the OLED panel 900 from being influenced by the touch driving signal, the display pixels are required to generate a constant brightness as the brightness generated in the display period. Therefore, when the touch driving signal is transmitted during the touch sensing period, the driving transistor DT' and the OLED L2 in the display pixels keep turned on, and another driving signal is transmitted to the power receiving terminal P3 via the ground line. Preferably, the touch driving signal transmitted to the power receiving terminal P4 and the driving signal transmitted to the power receiving terminal P3 have the same amplitude, frequency and phase. In such a situation, the voltage difference across the OLED L2 may be constant, so that the brightness of the OLED L2 may also be constant. The turned-off switch transistor ST' and the coupling of the capacitor CS' allow the gate-to-source voltage Vgs of the driving transistor DT' to be constant and thus maintain the balance of the driving transistor DT', so that the driving transistor DT' may not influence the brightness of the OLED L2.

Figure 10:
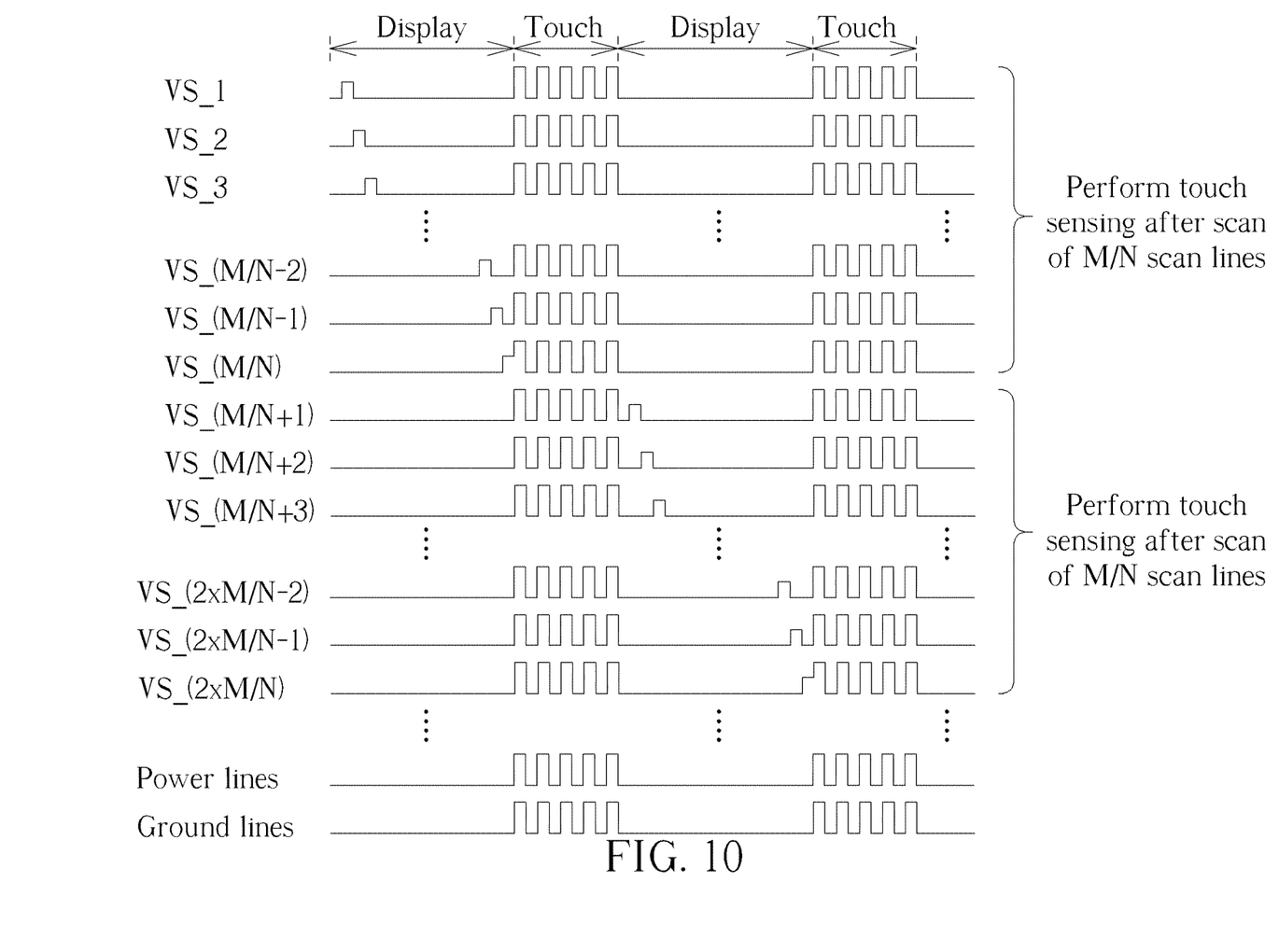
FIG. 10 is a timing diagram of a touch panel according to an embodiment of the present invention.

Please refer to FIG. 10, which is a timing diagram of a touch panel according to an embodiment of the present invention. There may be M scan lines in the touch panel and the touch driving signal may be transmitted by N times during display of a frame of image on the touch panel. Therefore, the touch driving signal is transmitted after every M/N scan lines are scanned, i.e., the number of scan lines which are scanned is M divided by N. More specifically, the display data is transmitted to M/N rows of display pixels when M/N scan lines are scanned during the display period, and then the touch sensing period starts and the touch driving signal is transmitted to the touch panel. Subsequently, the next M/N scan lines are scanned during the display period, and then the touch driving signal is transmitted during the touch sensing period, and so on. Note that M and N may be any feasible numbers and should not be a limitation of the present invention. In an embodiment, the touch panel includes 1080×1920 display pixels; that is, there are 1920 scan lines for 1920 rows of display pixels in the touch panel. If the touch sensing operation is required to be performed 24 times during display of an image frame, the touch driving signal is transmitted after every 80 scan lines are scanned (1920/24=80).

FIG. 10 illustrates waveforms of the scan lines VS_1-VS_M, power lines and ground lines. In this embodiment, the scan lines VS_1-VS_(M/N) are scanned in order, and then a rectangular wave signal as the touch driving signal is transmitted. Next, the scan lines VS_(M/N+1)-VS_(2×M/N) are scanned in order, and then a rectangular wave signal as the touch driving signal is transmitted. Until an entire frame of display data are transmitted to the corresponding display pixels, the touch sensing operation is performed by N times.

Please note that the power lines receive the power supply voltage VDD during the display period and receive a driving signal during the touch sensing period, and the ground lines receive the power supply voltage VSS during the display period and receive a driving signal during the touch sensing period. The touch driving signal may be transmitted to the ground lines while the power lines receive an identical driving signal to retain the brightness of the OLED and reduce capacitive loads on the touch panel. Alternatively, the touch driving signal may be transmitted to the power lines while the ground lines receive an identical driving signal to retain the brightness of the OLED and reduce capacitive loads on the touch panel. In addition, the scan lines VS_1-VS_M may also receive the identical driving signal during the touch sensing period, to reduce capacitive loads on the touch panel. The touch driving signal during one touch sensing period may include any number of signal pulses, which should not be a limitation of the present invention.

Figure 11:
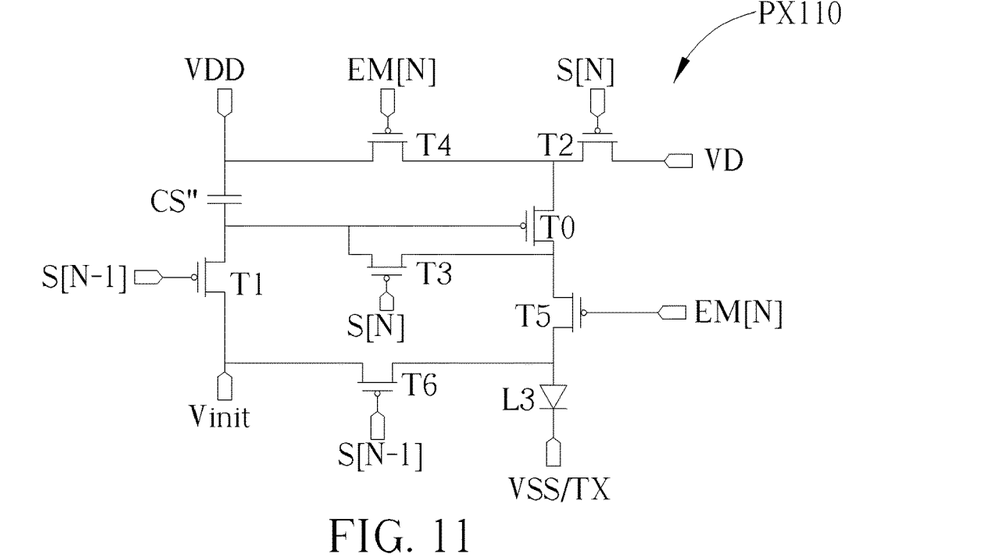
FIG. 11 is a schematic diagram of a display pixel of a touch panel according to an embodiment of the present invention.

Please refer to FIG. 11, which is a schematic diagram of a display pixel PX110 of a touch panel according to an embodiment of the present invention. As shown in FIG. 11, the display pixel PX110 includes an OLED L3, transistors T0-T6 and a capacitor CS", as a 7T1C structure of the AMOLED panel. In the display pixel PX110, the transistors T0-T6, respectively controlled by scan signals S[N−1] and S[N] and an emission control signal EM[N], are turned on in a sequence to perform brightness compensation.

Figure 12:
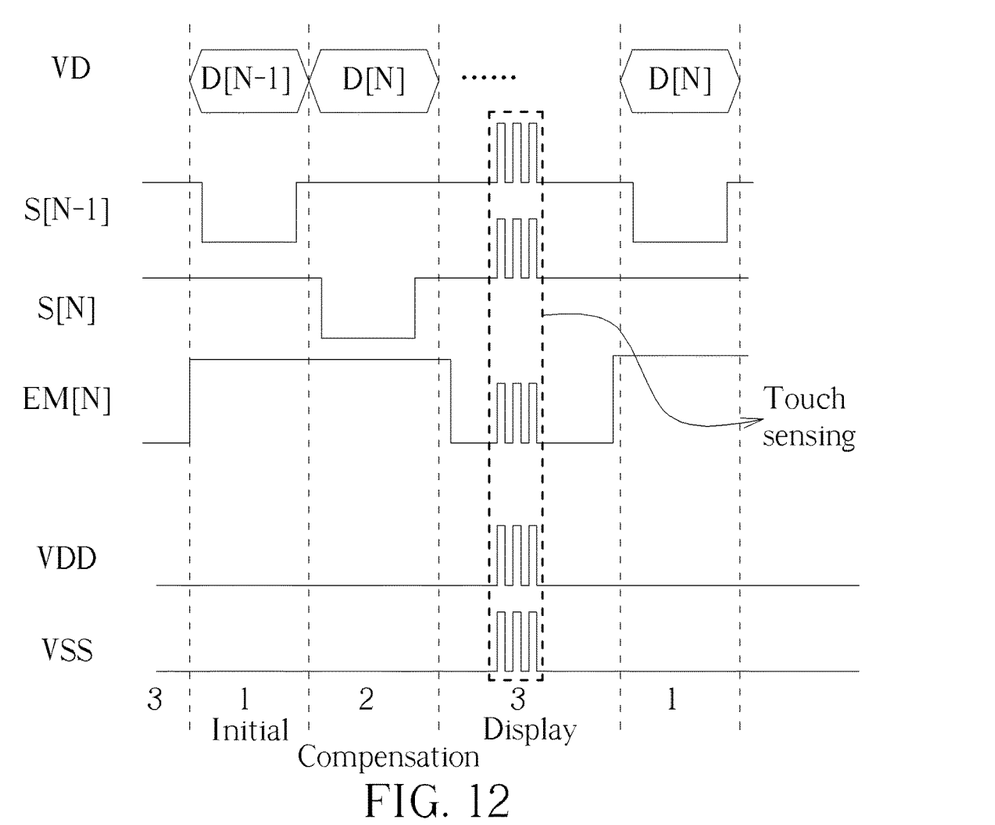
FIG. 12 is a timing diagram of the display pixel shown in FIG. 11.

FIG. 12 is a timing diagram of the display pixel PX110 shown in FIG. 11. As shown in FIG. 12, a scan cycle includes three phases: an initial phase, a compensation phase and a display phase. During the initial phase, the signal S[N−1] turns on the transistor T1 to pull the gate voltage of the driving transistor T0 to a lower level Vinit, allowing the gate voltage to be compensated in the follow-up phase. Note that the initial phase may be considered as the end of the previous scan cycle and the display data VD is outputted as a previous data D[N−1]. During the compensation phase, the display data VD becomes a present data D[N], and the signal S[N] turns on the transistor T2 to write the data D[N] into the source voltage of the driving transistor T0. The transistor T3 is turned on to let the driving transistor T0 to become diode-connected, in order to find out the threshold voltage of the driving transistor T0 and eliminate the influence of the threshold voltage on the brightness of the OLED L3, i.e., to compensate the brightness of the OLED L3. Subsequently, during the display phase, the emission control signal EM[N] turns on the transistors T4 and T5 to allow the drain current of the driving transistor T0 to flow through the OLED L3, so that the OLED L3 may emit light accordingly.

In this embodiment, the touch sensing operation is performed during the display phase. In other words, a touch sensing period is configured within the display phase of the scan cycle. During the touch sensing period, the scan signals S[N−1] and S[N] turn off their corresponding transistors and the emission control signal EM[N] turns on its corresponding transistors. The cathode electrode of the OLED L3, which receives the power supply voltage VSS during the display period, receives a touch driving signal TX to perform touch sensing operations. In addition, an identical driving signal, which has identical amplitude, frequency and phase, is transmitted on the scan signals S[N−1] and S[N], the emission control signal EM[N] and the power supply voltage VDD, in order to reduce the capacitive loads on the touch panel. The driving signal on the power supply voltage VDD further retains the voltage difference across the OLED L3. In such a situation, the gate-to-source voltage of the driving transistor T0 is maintained by the capacitor CS″, and the voltage difference across the OLED L3 is fixed to retain the brightness of the OLED L3. As a result, the OLED L3 may emit light with a constant brightness during the touch sensing period as well as during the display period.

Please note that the touch sensing period may be configured within the display phase, at the beginning of the display phase, or at the end of the display phase. No matter whether the OLED panel has a compensation function (e.g., the 7T1C structure) or not (e.g., the 2T1C structure), the compensation operation may not influence the touch driving and sensing operation performed during the touch sensing period.

Please also note that the timing control of transmitting the touch driving signal after every M/N scan operations is also applicable to the 7T1C pixel structure. Please refer to the timing diagram of FIG. 10 together with the detailed timing diagram of FIG. 12. From the $1^{st}$ scan cycle to the $(M/N−1)^{th}$ scan cycle, each scan cycle includes the initial phase, the compensation phase and the display phase, where the touch sensing operation may not be performed. In the $(M/N)^{th}$ scan cycle, the initial phase, the compensation phase and the display phase are also included, where the display phase may further include a touch sensing period in which the touch driving signal is transmitted. Subsequently, from the $(M/N+1)^{th}$ scan cycle to the $(2×M/N−1)^{th}$ scan cycle, each scan cycle includes the initial phase, the compensation phase and the display phase, where the touch sensing operation may not be performed. In the $(2×M/N)^{th}$ scan cycle, the initial phase, the compensation phase and the display phase are also included, where the display phase may further include a touch sensing period in which the touch driving signal is transmitted. By the same token, the touch sensing operation is performed by N times when M scan cycles are completed, i.e., the display data of an image frame is completely transmitted.

Preferably, the touch sensing period is included in the display phase without extending the length of the display phase, so that the time length configured for performing compensation may not be reduced. No matter whether the touch sensing operation is performed in a scan cycle, the length of the display phase is fixed. In other words, the length of a display phase including the touch sensing period is equal to the length of a display phase without the touch sensing period.

In an embodiment, during a touch sensing period, the touch driving signal may be transmitted to every touch sensing electrode in the touch panel and the corresponding touch sensing signal may be received from every touch sensing electrode. In another embodiment, during a touch sensing period, the touch driving signal may be transmitted to apart of touch sensing electrodes in the touch panel, and the touch sensing signal is received from this part of touch sensing electrodes. For example, when a specific image is displayed in the upper half part of the touch panel, the touch sensing operations on the upper half part of the touch panel may be interrupted to prevent the specific image from being influenced by the touch sensing operations.

Figure 13:
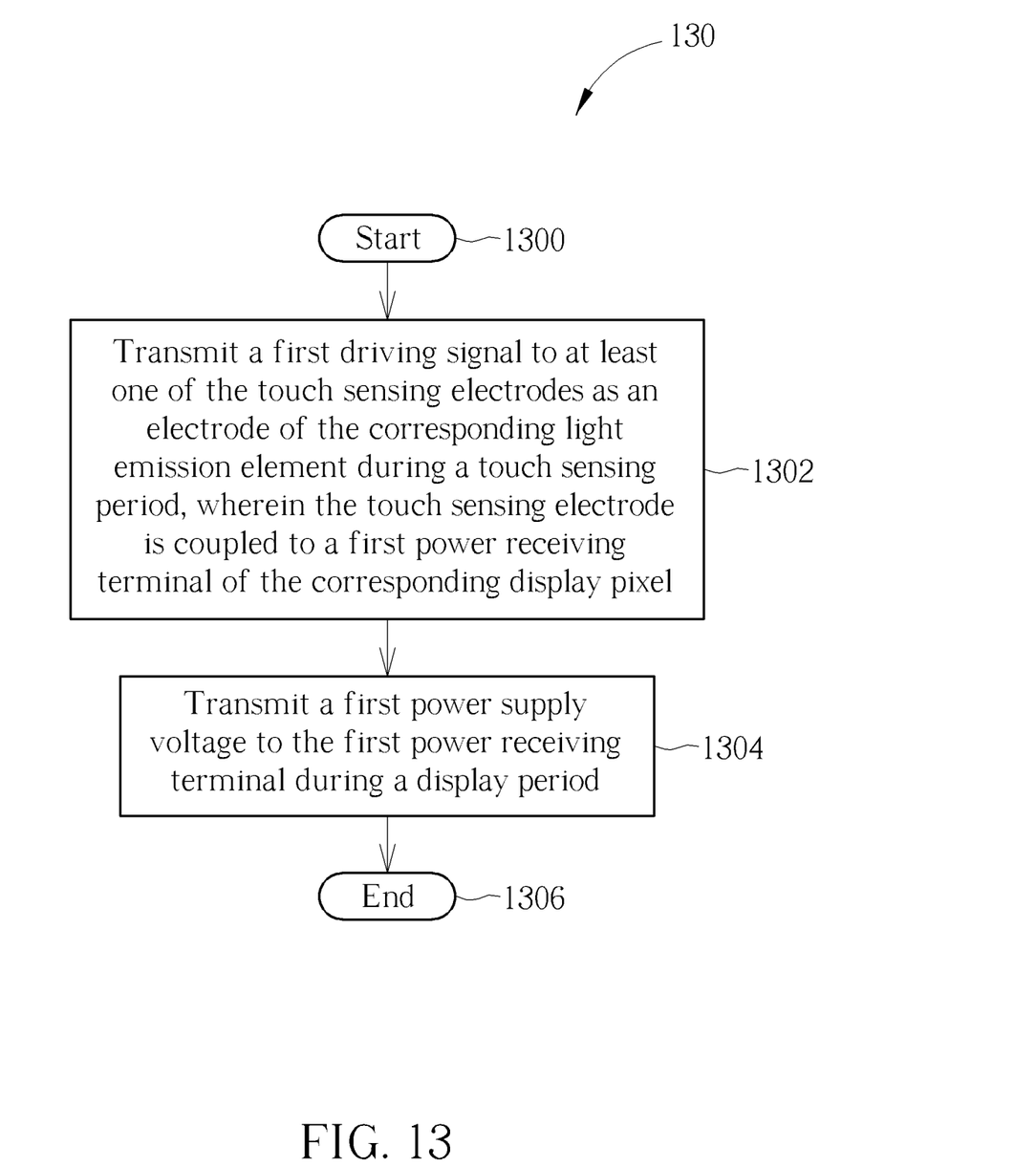
FIG. 13 is a schematic diagram of a process according to an embodiment of the present invention.

The abovementioned operations of a touch with display driver system may be summarized into a process 130, as shown in FIG. 13. The process 130, which may be realized in a controller of the touch with display driver system such as the controller 410 shown in FIG. 4, includes the following steps:

Step 1300: Start.

Step 1302: Transmit a first driving signal to at least one of the touch sensing electrodes as an electrode of the corresponding light emission element during a touch sensing period, wherein the touch sensing electrode is coupled to a first power receiving terminal of the corresponding display pixel.

Step 1304: Transmit a first power supply voltage to the first power receiving terminal during a display period.

Step 1306: End.

The detailed operations and alternations of the process 130 are illustrated in the above paragraphs, and will not be narrated herein.

To sum up, the embodiments of the present invention provide a touch driving and sensing method and a related touch with display driver system which includes a controller and a touch panel. Each display pixel of the touch panel includes a light emission element such as an OLED. During the touch sensing period, an electrode of the light emission element may act as a touch sensing electrode of the touch panel, for receiving a touch driving signal from the controller and returning a touch sensing signal to the controller. During the display period, the electrode of the light emission elements may act as a power receiving terminal, for receiving a power supply voltage from the controller or a power supply module. The controller may also transmit an identical driving signal to another power receiving terminal of the display pixel when transmitting the touch driving signal to the electrode of the light emission element. In such a situation, the light emission element may not only emit light during the display period, but also emit light with a constant brightness during the touch sensing period. Other metal lines such as the scan lines and data lines on the touch panel may also be driven by the identical driving signal, to prevent or reduce the capacitive loads on the touch panel. An in-cell touch panel with self-capacitance touch sensing function is thereby realized.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the disclosure (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate the disclosure and does not pose a limitation on the scope of the disclosure unless otherwise claimed. No language in the specification should be construed as indicating any non-claimed element as essential to the practice of the disclosure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of driving a touch panel, the touch panel comprising a plurality of touch sensing electrodes and a plurality of display pixels, each of the plurality of display pixels comprising a light emission element and a driving transistor and having a first power receiving terminal and a second power receiving terminal, each of the touch sensing electrodes coupled to the light emission element of at least one of the plurality of display pixels, the method comprising:
   transmitting a first driving signal to at least one of the touch sensing electrodes served as an electrode of the corresponding light emission element during a touch sensing period, wherein the touch sensing electrode is coupled to the first power receiving terminal of the at least one display pixel coupled to the touch sensing electrode;
   transmitting a first power supply voltage to the first power receiving terminal during a display period; and
   transmitting a second driving signal to the second power receiving terminal of the at least one display pixel coupled to the touch sensing electrode receiving the first driving signal when the first driving signal is transmitted, wherein the second driving signal is generated through a power switch by alternately outputting a second power supply voltage and a third power supply voltage having different voltage levels.

2. The method of claim 1, further comprising controlling the driving transistor of the at least one display pixel coupled to the touch sensing electrode receiving the first touch driving signal to keep turned on when the first touch driving signal is transmitted.

3. The method of claim 1, wherein the second driving signal and the first touch driving signal substantially have the same amplitude, frequency and phase.

4. The method of claim 1, wherein each of the plurality of display pixels further comprises a first transistor coupled between the light emission element and the driving transistor of the corresponding display pixel.

5. The method of claim 4, further comprising controlling the first transistor to be turned off when the first touch driving signal is transmitted.

6. The method of claim 1, wherein the touch panel is an organic light emitting diode (OLED) panel, and the light emission element is an OLED.

7. The method of claim 6, wherein each of the touch sensing electrodes is the cathode electrode of the OLED, and the driving transistor is a P-type metal oxide semiconductor (PMOS) transistor coupled to the anode electrode of the OLED.

8. The method of claim 6, wherein each of the touch sensing electrodes is the anode electrode of the OLED, and the driving transistor is an N-type metal oxide semiconductor (NMOS) transistor coupled to the cathode electrode of the OLED.

9. The method of claim 1, further comprising:
   transmitting a third driving signal to at least one of a plurality of data lines and a plurality of scan lines of the touch panel when the first touch driving signal is transmitted.

10. The method of claim 9, wherein the third driving signal and the first touch driving signal substantially have the same amplitude, frequency and phase.

11. The method of claim 1, wherein there are M scan lines in the touch panel and the first touch driving signal is transmitted by N times during display of a frame of image on the touch panel, and the first touch driving signal is transmitted after every M/N scan lines are scanned.

12. The method of claim 1, wherein the first touch driving signal is transmitted and sensed with a self-capacitance touch sensing operation.

13. A touch display system, comprising:
   a touch panel, comprising:
      a plurality of display pixels, each comprising a light emission element and a driving transistor and having a first power receiving terminal and a second power receiving terminal; and
      a touch sensing electrode layer, comprising a plurality of touch sensing electrodes, each of which coupled to the light emission element of at least one of the plurality of display pixels;
   a controller, coupled to the touch sensing electrode layer and the first power receiving terminal of the plurality of display pixels, for transmitting a first driving signal to at least one of the touch sensing electrodes served as an electrode of the corresponding light emission element during a touch sensing period, wherein the touch sensing electrode is coupled to the first power receiving terminal of the at least one display pixel coupled to the touch sensing electrode;
   a power controller, coupled to the controller, for generating a second power supply voltage and a third power supply voltage according to a control signal from the controller; and
   a power switch, coupled to the power controller, for generating a second driving signal by outputting the second power supply voltage and the third power supply voltage alternately, and transmitting the second driving signal to the second power receiving terminal of the at least one display pixel coupled to the touch sensing electrode receiving the first driving signal when the first driving signal is transmitted.

14. The touch display system of claim 13, wherein the controller further transmits a first power supply voltage to the first power receiving terminal during a display period.

15. The touch display system of claim 13, wherein the driving transistor of the at least one display pixel coupled to the touch sensing electrode receiving the first touch driving signal are configured to keep turned on when the first touch driving signal is transmitted.

16. The touch display system of claim 13, wherein the second driving signal and the first touch driving signal substantially have the same amplitude, frequency and phase.

17. The touch display system of claim 13, wherein each of the plurality of display pixels further comprises a first transistor coupled between the light emission element and the driving transistor of the corresponding display pixel.

18. The touch display system of claim 17, wherein the first transistor is configured to be turned off when the first touch driving signal is transmitted.

19. The touch display system of claim 13, wherein the touch panel is an organic light emitting diode (OLED) panel, and the light emission element is an OLED.

20. The touch display system of claim 19, wherein each of the touch sensing electrodes is the cathode electrode of the OLED, and the driving transistor is a P-type metal oxide semiconductor (PMOS) transistor coupled to the anode electrode of the OLED.

21. The touch display system of claim 19, wherein each of the touch sensing electrodes is the anode electrode of the OLED, and the driving transistor is an N-type metal oxide semiconductor (NMOS) transistor coupled to the cathode electrode of the OLED.

22. The touch display system of claim 13, wherein the controller further transmits a third driving signal to at least one of a plurality of data lines and a plurality of scan lines of the touch panel when the first touch driving signal is transmitted.

23. The touch display system of claim 22, wherein the third driving signal and the first touch driving signal substantially have the same amplitude, frequency and phase.

24. The touch display system of claim 13, wherein there are M scan lines in the touch panel and the first touch driving signal is transmitted by N times during display of a frame of image on the touch panel, and the first touch driving signal is transmitted after every M/N scan lines are scanned.

25. The touch display system of claim 13, wherein the controller is coupled to the touch sensing electrode layer and the first power receiving terminal via a driving line, which is disposed between a power line and a data line adjacent to the power line in a metal layer of the touch panel.

26. The touch display system of claim 13, wherein the first touch driving signal is transmitted and sensed with a self-capacitance touch sensing operation.

* * * * *